(12) United States Patent
Maruyama et al.

(10) Patent No.: US 6,329,879 B1
(45) Date of Patent: Dec. 11, 2001

(54) HIGH FREQUENCY POWER AMPLIFIER SYSTEM AND WIRELESS COMMUNICATION SYSTEM

(75) Inventors: Masashi Maruyama; Hitoshi Akamine, both of Komoro; Tsutomu Kobori, Higashimurayama; Shinji Moriyama, Komoro, all of (JP)

(73) Assignees: Hitachi, Ltd.; Hitachi ULSI Systems Co., Ltd., both of Tokyo; Hitachi Tohbu Semiconductor, Ltd., Gunma, all of (JP)

( * ) Notice: Subject to any disclaimer, the term of this patent is extended or adjusted under 35 U.S.C. 154(b) by 0 days.

(21) Appl. No.: 09/437,264

(22) Filed: Nov. 10, 1999

(30) Foreign Application Priority Data

Nov. 12, 1998 (JP) .................................................. 10-321903

(51) Int. Cl.[7] ....................................................... H03F 3/04
(52) U.S. Cl. ........................ 330/289; 330/133; 330/134; 330/310
(58) Field of Search ................................... 330/133, 134, 330/289, 310

(56) References Cited

U.S. PATENT DOCUMENTS

| | | | | |
|---|---|---|---|---|
| 4,207,538 | * | 6/1980 | Goel | 330/289 |
| 5,914,641 | * | 6/1999 | Yun et al. | 330/302 |
| 6,172,567 | * | 1/2001 | Ueno et al. | 330/285 |

FOREIGN PATENT DOCUMENTS

| | | | | |
|---|---|---|---|---|
| 59161106 | * | 9/1984 | (JP) | 330/302 |
| 1-139613 | | 9/1989 | (JP) | . |
| 5-199040 | | 8/1993 | (JP) | . |
| 8-65059 | | 3/1996 | (JP) | . |

OTHER PUBLICATIONS

K. Otobe et al, "A 1.9GHz Band Power Amplifier Module", Technical Report of the Institute of Electronics, Information and Communication Engineers, 1997–06, pp. 37–42 (with English language translation).

H. Furukawa et al, "Temperature Compensation Technique of GaAs FET by Rotating the Gate Orientation", Technical Report of the Institute of Electronics, Information and Communication Engineers, 1998–01, pp. 9–14, (with English language translation).

* cited by examiner

Primary Examiner—Michael B Shingleton
(74) Attorney, Agent, or Firm—Mattingly, Stanger & Malur, P.C.

(57) ABSTRACT

Disclosed herein is a high frequency power amplifier system having a transistor comprised of a first electrode, a second electrode and a control electrode and for controlling current which flows between the first electrode and the second electrode by applying a potential to the control electrode, and a resistance type potential divider circuit for determining a dc bias potential applied to the control electrode of the transistor, and wherein an input signal is inputted to the control electrode, an output signal is outputted from the first electrode and a control signal is inputted to the resistance type potential divider circuit. One resistor of the resistance type potential divider circuit is comprised of a temperature compensating resistor whose resistance value varies linearly, so that a temperature characteristic of an idle current defined as an output when the control signal is not inputted, assumes a negative temperature characteristic.

4 Claims, 13 Drawing Sheets

THEORETICAL VALUE OF IDLE CURRENT

HIGH FREQUENCY POWER AMPLIFIER SYSTEM AND WIRELESS COMMUNICATION SYSTEM

BACKGROUND OF THE INVENTION

FIELD OF THE INVENTION

The present invention relates to a high frequency power amplifier system and a mobile communication system with the high frequency power amplifier system built therein such as a cellular phone, and particularly to a technique effective for application to a high frequency power amplifier system (high frequency power amplifier module) which is used in a phase modulation (PM) system or the like and requires low distortion.

A high frequency power amplifier system has been used in a transmitter of a mobile communication system such as a car phone, a handyphone system or the like.

In digital handyphone systems such as PDC (Personal Digital Cellular), PHS (Personal Handyphone System), N-CDMA (code division multiple access), W-CDMA, etc., a phase modulation system has been adopted as a modulation scheme.

An improvement in distortion characteristic of a power amplifier with respect to a change in temperature is of importance in the phase modulation system. In order to achieve the stabilization of the distortion characteristic, the stabilization (fixing) of a drain current has heretofore been carried out.

As techniques for achieving the stabilization of the drain current, (1) a system for adding parts such as diodes, a thermistor, etc. to a circuit, (2) a system for changing the direction of a crystal axis of an FET (Field-Effect Transistor) to thereby control a change in impedance due to internal stress (piezo) ("Report ED97-182 on Technical Investigations of the Institute of Electronics, Information and Communication Engineers" issued by the Institute of Electronics, Information and Communication Engineers, 1998-01, P9–P14), and (3) a system ("Report MW97-33 on Technical Investigations of the Institute of Electronics, Information and Communication Engineers" issued by the Institute of Electronics, Information and Communication Engineers, 1997-06, P37–P42) for matching an operating point with a bias point (cross point: point Q) at which no drain current changes even if the temperature changes in a voltage (Vg) vs. current (Ids/IdssO) characteristic of each FET, etc. have been adopted.

SUMMARY OF THE INVENTION

A mobile communication system (cellular phone system) needs to reduce adjacent channel leakage power (ACP) at idle and make a call at an adjacent channel satisfactory.

A gate bias circuit of a conventional high frequency power amplifier is constructed as shown in FIG. 25. The high frequency power amplifier 1 has an input terminal (Pin) 2, an output terminal (Pout) 3, a first reference potential terminal, e.g., a voltage terminal (Vdd) 4, a control terminal (Vgg) 5, and a second reference potential terminal, e.g., a ground terminal (GND) 6.

A matching circuit 10 is provided between a gate terminal G (control terminal) of a transistor (FET) 7 and the input terminal (Pin) 2. A drain terminal D (first terminal) of the FET 7 is electrically connected to the voltage terminal (Vdd) 4 through a source or power line 11 and connected to the output terminal (Pout) 3 through a matching circuit 12. A source terminal S (second terminal) of the FET 7 is electrically connected to the ground terminal (GND) 6. The FET 7 is an HEMT (High Electron Mobility Transistor) composed of, for example, a GaAs compound semiconductor.

Further, two resistors 15 and 16 are electrically connected to the gate terminal G of the FET 7. The resistor R1 (15) on the high potential side is electrically connected to the ground terminal (GND) 6, and the resistor R2 (16) on the low potential side is electrically connected to the control terminal (Vgg) 5, both of which constitute a resistance type potential divider circuit (bleeder circuit). The resistors 15 and 16 are chip resistors respectively. Since a resistance portion of each chip resistor is made up of a thick film resistance, the chip resistor has hardly a temperature characteristic.

Since a portable terminal such as a portable telephone is used outdoors, the power amplifier needs a temperature characteristic stable over a range of from −20° C. to 85° C., for example. An amplifier (having, for example, a multistage configuration in which a single FET or FET are successively cascade-connected in plural form) deteriorates a distortion characteristic because it has a positive temperature coefficient and an idle current changes according to the temperature.

Since the gate bias (Vgs) circuit is comprised of the chip resistors having hardly the temperature characteristic as described above, the change in idle current has heretofore exerted a bad influence directly on the distortion.

The above-described respective systems have been adopted to make constant the idle current, in other words, drain current of the high frequency power amplifier system.

However, the above means (1) for adding the parts such as the diodes, thermistor, etc. makes use of outboard parts. Thus, the means increases not only the number of parts but also the scale of a circuit for matching each FET with a temperature coefficient.

Further, the above means (2) for changing the direction of the crystal axis of the FET to thereby control the change in the impedance due to the internal stress (piezo) changes stress according to a substrate equipped with an FET and is inferior in general versatility.

Furthermore, the above means (3) using the point Q is inferior in general versatility because it is shifted in position according to FET characteristics.

In such a high frequency power amplifier 1 on the other hand, the two resistors constituting the above-described bleeder circuit comprise the chip resistors and their resistance values are kept constant even if the temperature varies. In contrast to this, the internal resistance of the FET changes with an increase in temperature and the idle current of the FET 7 increases (it has a positive temperature characteristic at about 0.14%/° C., for example). As a result, the operating point varies and thereby the distortion characteristic and efficiency greatly change.

On the other hand, there has been a demand for an improvement in efficiency of the portable terminal. The efficiency and ACP are placed in a so-called trade-off relationship in that the other of them becomes worse if one thereof becomes better and vice versa.

Therefore, the portable terminal has heretofore been designed at some penalties in efficiency and with an increased margin of ACP at ordinary temperatures.

The present inventors have measured idle currents at temperatures of −20° C., 25° C. and 100° C. to obtain the optimum idle current value at the time that ACP is at detuning of ±50 KHz. The result of measurements is indicated by a graph shown in FIG. 26. It is understood from the same graph that there is a tendency that when the temperature is low, the idle current increases, whereas as the temperature increases, the idle current decreases.

Further, a change in temperature with respect to the idle current is already known to date in the sense that a change in channel resistance and a change in parasitic capacitance influence the impedance due to a piezo effect produced by thermal stress which acts between each FET and the substrate equipped with it.

As a result of basic investigations of a method for changing Vgs to cancel such a change in impedance to thereby vary the input impedance of a gate, thus improving distortion, the present inventors have traced the fact that the distortion could be held constant by allowing the idle current of an amplifier to have a negative temperature characteristic.

Therefore, the present inventors have found out that owing to the setting of the resistor R1 on the high potential side, of the bleeder circuit as a temperature compensating resistor having a positive temperature coefficient and an increase in the resistance value of the resistor R1 on the high potential side with a rise in temperature, the potential at the gate terminal G could be reduced to thereby restrain the idle current from increasing with the rise in temperature, and an APC characteristic could be lowered and flattened, thus leading to the completion of the present invention.

An object of the present invention is to provide an amplifier (high frequency power amplifier system) satisfactory in distortion characteristic and a wireless communication system using it.

Another object of the present invention is to provide an amplifier (high frequency power amplifier system) which obtains high efficiency owing to the lowering and flattening of an ACP characteristic, and a wireless communication system using it.

A further object of the present invention is to provide a temperature compensating resistor whose resistance value varies linearly and which has a positive temperature coefficient.

The above, and other objects and novel features of the present invention will become apparent from the description of the present specification and the accompanying drawings.

Summaries of typical ones in the invention disclosed in the present application will be described in brief as follows:

(1) A high frequency power amplifier system, comprises:
an input terminal;
an output terminal;
a control terminal;
a first semiconductor amplifying device having a control terminal which receives a signal from the input terminal, and a first terminal which outputs a signal corresponding to the signal inputted from the input terminal;
a second semiconductor amplifying device having a control terminal which receives a signal corresponding to the signal outputted from the first terminal of the first semiconductor amplifying device, and a first terminal connected to the output terminal and which outputs a signal according to the signal; and
a bias circuit comprised of a resistance type potential divider circuit which is connected to the control terminal and applies a dc bias potential corresponding to a voltage supplied to the control terminal to the control terminal of the first semiconductor amplifying device;
wherein a resistor provided on the high potential side, of the resistance type potential divider circuit is comprised of a temperature compensating resistor whose resistance value varies linearly, so that a temperature characteristic of an idle current used as an output when the signal is not inputted from the input terminal, assumes a negative temperature characteristic.

The resistor provided on the high potential side, of the resistance type potential divider circuit is monolithically formed over a semiconductor substrate with the first semiconductor amplifying device formed therein, and other resistors thereof are outboard parts Further, the high frequency power amplifier system includes a bias circuit comprised of a resistance type potential divider circuit which is connected to the control terminal and applies a dc bias potential corresponding to a voltage supplied to the control terminal to the control terminal of the second semiconductor amplifying device, and wherein the resistor provided on the high potential side, of the resistance type potential divider circuit is comprised of a temperature compensating resistor whose resistance value varies linearly, so that a temperature characteristic of an idle current used as an output when the signal is not inputted from the input terminal, is brought to a negative temperature characteristic.

The bias circuit for controlling the control terminal of the first semiconductor amplifying device and the bias circuit for controlling the control terminal of the second semiconductor amplifying device are circuits independent of each other.

In the bias circuit, the resistor provided on the high potential side, of the resistance type potential divider circuit exhibits a positive temperature characteristic, and other resistors are resistors substantially non-dependent on the temperature.

The resistor provided on the high potential side, of the resistance type potential divider circuit is monolithically formed over a semiconductor substrate with a semiconductor amplifying device formed therein, and other resistors thereof are outboard parts.

The high frequency power amplifier system includes at least one or more third semiconductor amplifying devices cascade-connected between the first semiconductor amplifying device and the second semiconductor amplifying device, and wherein the one or more third semiconductor amplifying devices include a control terminal connected to a first terminal of a previous-stage semiconductor amplifying device and a first terminal connected to a control terminal of a subsequent-stage semiconductor amplifying device.

The first semiconductor amplifying device operates with class-A amplification. The second semiconductor amplifying device operates with class-AB amplification and other semiconductor amplifying devices operate with the class-A amplification.

Each semiconductor amplifying device referred to above is comprised of a field effect transistor composed of a silicon semiconductor.

The high frequency power amplifier system constructed as described above is incorporated into output means on the transmission side, of a wireless communication system.

(2) In the construction of the above means (1), a lag lead filter comprised of a resistor and a capacitor is incorporated into a control electrode of the semiconductor amplifying device, and the resistor constituting the lag lead filter is comprised of a temperature compensating resistor whose resistance value varies linearly.

(3) In the construction of the above means (1) or (2), the bias circuit for controlling the control terminal of the first semiconductor amplifying device controls the amplitude of the signal outputted from the first terminal.

(4) In any of the constructions of the above means (1) through (3), each semiconductor amplifying device referred to above comprises a MESFET composed of a compound semiconductor, a high electron mobility transistor composed of a compound semiconductor or a hetero junction bipolar transistor composed of a compound semiconductor.

(5) A resistor comprises an insulating substrate, a conductor whose resistance value varies linearly, which is formed over at least the whole surface of the insulating substrate, an electrode electrically connected to one end of the conductor, and an electrode electrically connected to the other end of the conductor. The conductor is formed of any of silicon, GaAs and germanium. For example, the insulating substrate is constructed as a semi-insulating GaAs substrate, and the conductor has a structure formed by diffusing an impurity into at least the whole surface of the semi-insulating GaAs substrate.

According to the above means (1), (a) in a high frequency power amplifier system in which transistors are incorporated in multi-stage form, resistors on the high potential sides, of resistance type potential divider circuits connected to control electrodes of the respective transistors are comprised of temperature compensating resistors whose resistance values vary linearly. Therefore, when the temperature rises, the resistance values of the temperature compensating resistors successively increase and the potential at each control electrode is relatively lowered, whereby a temperature characteristic of an idle current is rendered negative. As a result, distortion in a compensation temperature entire region is less reduced so that an improvement in distortion characteristic can be achieved. Since the bias circuit including the temperature compensating resistor is provided at an input stage in particular, the distortion characteristic becomes satisfactory.

(b) Owing to a reduction in idle current, adjacent channel leakage power ACP can be controlled low and the efficiency can be also improved.

(c) The resistor on the high potential side, of each resistance type potential divider circuit is simply constructed as the temperature compensating resistance. It is also unnecessary to attach all the parts as other parts (outboard parts) for the purpose of making the drain current constant as in the prior art. Thus, the manufacturing cost of the high frequency power amplifier system can be reduced owing to a reduction in the number of parts and a reduction in the number of assembly manhours.

(d) The number of the outboard parts is reduced due to the above (c) and hence the high frequency power amplifier system can be brought into less size.

(e) Since the temperature compensating resistor is monolithically formed over a semiconductor substrate used to form each transistor, a high frequency power amplifier system can be reduced in size as compared with a structure in which each resistor on the high potential side is assembled as a chip resistor (outboard part).

(f) In a wireless communication system wherein the high frequency power amplifier system constructed as described above is used in its transmitting unit, an improvement in distortion characteristic, an increase in efficiency, a size reduction and a reduction in manufacturing cost can be achieved. In particular, a reduction in power consumption can be achieved owing to the improvement in efficiency. As a result, a call time interval can be made long and a battery can be brought into less size. The size reduction of the battery allows further multifunctioning and size reduction of the wireless communication system.

According to the means described in the paragraph (2), since the lag lead filter comprised of the resistor and the capacitor is incorporated into the control terminal, it has the effects of preventing oscillations. Further, since the resistor constituting the lag lead filter is also monolithically formed over the semiconductor substrate with each transistor formed thereon, it is possible to prevent the high frequency power amplifier system from increasing in size.

According to the means described in the above paragraph (3), a linear amplifier produces distortion when an operating point is shifted. However, the fixing of the operating point and adjustments on output power by input power control allow transmission with high efficiency while maintaining a satisfactory distortion characteristic.

According to the means described in the above paragraph (4), any of a MESFET, a high electron mobility transistor and a hetero junction bipolar transistor each used as the semiconductor amplifying device is capable of having the respective effects referred to above.

According to the means described in the above paragraph (5), (a) a temperature compensating resistor can be provided which is used as a single part whose resistance value varies linearly. Further, a temperature compensating resistor can be also provided which is used as a GaAs single part whose resistance value varies linearly.

DESCRIPTION OF THE PREFERRED EMBODIMENTS

Figure 1:
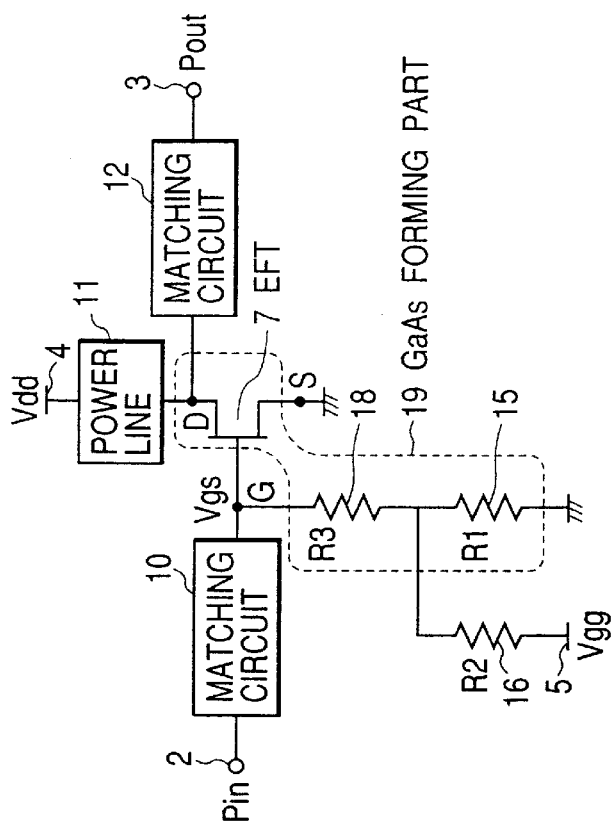
FIG. 1 is an equivalent circuit diagram of a high frequency power amplifier system showing one embodiment (embodiment 1) of the present invention.

Preferred embodiments of the present invention will hereinafter be described in detail with reference to the accompanying drawings. In all the drawings for describing the embodiments of the invention, elements of structure having the same function are identified by like reference numerals and their repetitive description will be omitted.
(Embodiment 1)

FIG. 1 is an equivalent circuit diagram of a high frequency power amplifier system showing one embodiment (embodiment 1) of the present invention. The present (embodiment 1) will be explained by an example using an HEMT (High Electron Mobility Transistor) comprised of, e.g., a GaAs compound semiconductor as a transistor (semiconductor amplifying device).

The high frequency power amplifier system (high frequency power amplifier: high frequency power amplifier module) according to the present (embodiment 1) has an input terminal (Pin) 2, an output terminal (Pout) 3, a first reference potential terminal, e.g., a voltage terminal (Vdd) 4, a control terminal (Vgg) 5, and a second reference potential terminal, e.g., a ground terminal (GND) 6.

A matching circuit 10 is provided between a gate terminal G electrically connected to a gate electrode (control electrode) of a transistor 7 and the input terminal (Pin) 2. A drain terminal D corresponding to a first terminal of the transistor 7 is electrically connected to the voltage terminal (Vdd) 4 though a source or power line 11 and electrically connected to the output terminal (Pout) 3 via a matching circuit 12. A source terminal S (second terminal) electrically connected to a source electrode of the transistor 7 is electrically connected to the ground terminal (GND) 6.

Further, two resistors 15 and 16 are electrically connected to the gate terminal G of the transistor 7. The resistor R1 (15) on the high potential side is electrically connected to the ground terminal (GND) 6, and the resistor R2 (16) on the low potential side is electrically connected to the control terminal (Vgg) 5, both of which constitute a resistance type potential divider circuit (bleeder circuit).

Further, a resistor R3 (18) is provided between the resistance type potential divider circuit and Vgs. The resistor R3 (18) has the effects of controlling or restraining the impedance on the resistance type potential divider circuit side, which influences the gate electrode side.

The resistor (resistor R2 on the low potential side) 16 is a chip resistor (outboard part) comprised of a thin-film resistance, whereas the resistor (resistor R1 on the high potential side) 15 is comprised of a temperature compensating resistance or resistor having a positive temperature coefficient, whose resistance value varies linearly. In the present (embodiment 1), the resistor R1 (15) on the high potential side is monolithically formed over a semiconductor substrate used to form each transistor 7. Namely, although described later, the transistor 7 is formed over a GaAs substrate, and the resistor R1 (15) on the high potential side is a resistance in which a diffusion region formed by diffusing an impurity into the surface of the GaAs substrate is used as a resistor (conductor). The transistor 7 and the resistor R1 (15) on the high potential side are monolithically formed over the same semiconductor chip 19. The positive temperature coefficient of the temperature compensating resistor is set to, for example, about 0.12%/° C.

According to the high frequency power amplifier system 1 of the present (embodiment 1), (1) since one resistor (resistor R1 (15) on the high potential side) of the resistance type potential divider circuit is comprised of the temperature compensating resistance whose resistance value varies linearly, and the other resistor (the resistor R2 (16) on the low potential side) is comprised of the thin-film resistance whose resistance value is substantially constant, Vgs becomes low with an increase in temperature and hence an idle current is reduced, so that a distortion characteristic is improved.

Figure 11:
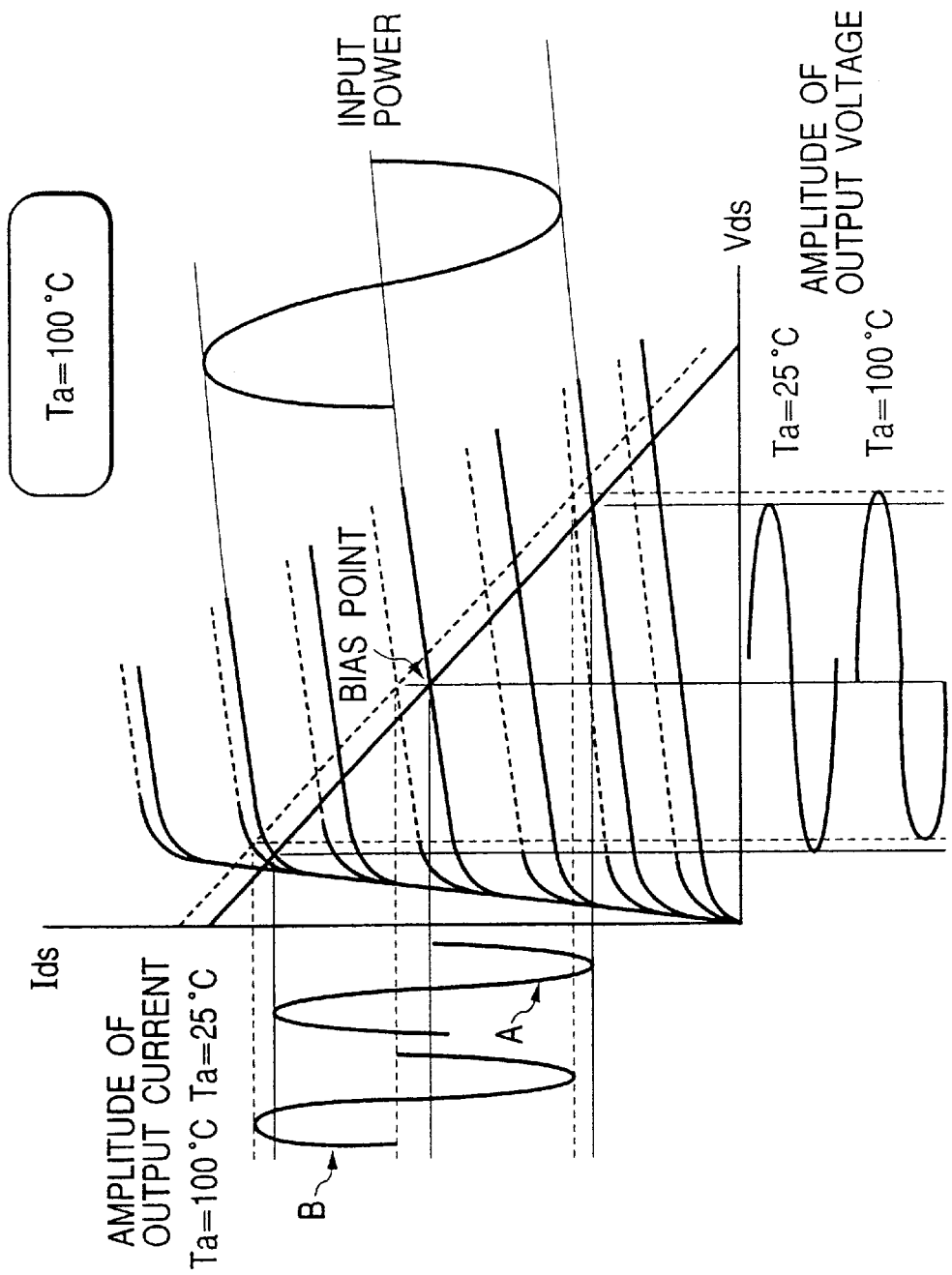
FIG. 11 is a schematic diagram showing the correlation between IV (Ids–Vds) characteristics, a load line and output waveforms.

A description will now be made of the improvement in distortion characteristic. FIG. 11 is a diagrammatic illustration showing the correlation between Ids-Vds characteristics, a load line and output waveforms. In the case of class-A amplification in which such a gate voltage that the central portion of the load line takes a bias point, is selected and used, an output waveform (output current amplitude) with respect to an input waveform of an input signal does not produce distortion indicated by a waveform A on the left side of the same drawing as indicated by a solid line when the temperature is 25° C., whereas when the temperature reaches 100° C., for example, the output waveform is distorted as indicated by a broken line.

Namely, when the temperature becomes high, the operating point (bias point) is shifted and the symmetry (positive and negative amplitudes) of the output waveform becomes lost as indicated by a waveform B, whereby clipping of the waveform occurs.

However, the resistor R1 (15) on the high potential side, of the resistance type potential divider circuit (bleeder circuit) is set as the temperature compensating resistance and the resistor R2 (16) on the low potential side is set as a fixed type non-dependent on the temperature. As a result, the bias point can be lowered and the symmetry of the waveform can be reproduced. Namely, an idle state in which no signal is supplied to the input terminal, indicates a negative characteristic, so that the idle current can be reduced.

(2) Efficiency can be improved owing to the reduction in idle current.

(3) Since the resistor R1 (15) on the high potential side, of the resistance type potential divider circuit is simply set as the temperature compensating resistance whose resistance value varies linearly, the high frequency power amplifier system 1 according to the present (embodiment 1) eliminates the need for the attachment of other parts for the purpose of making the drain current constant as in the prior art and can achieve a reduction in the number of parts.

(4) Since the resistor R3 (18) is provided between the resistance type potential divider circuit and Vgs, it is possible to achieve stabilization of the characteristic of each matching circuit and a reduction in the size of a product.

(5) Owing to a reduction in the number of parts and a reduction in the number of assembly manhours with the reduction in the number of the parts, the manufacturing cost of the high frequency power amplifier system 1 can be reduced.

(6) Since the reduction in the number of the parts can be achieved, the high frequency power amplifier system can be brought into less size.

While the present (embodiment 1) has described the high frequency power amplifier system 1 in which the single transistor has been incorporated, it can be applied even to a high frequency power amplifier system having a multistage configuration wherein a plurality of transistors are sequentially cascade-connected. In this case, a resistor on the high potential side, of a resistance type potential divider circuit of at least the initial-stage (input-stage) transistor is set as a temperature compensating resistance whose resistance value varies linearly.

A more specific example (embodiment) of the present invention will next be described.

[Embodiment 1]

FIGS. 2 through 8 are respectively diagrams related to a high frequency power amplifier system (high frequency power amplifier module) according to the present [embodiment 1].

Figure 3:
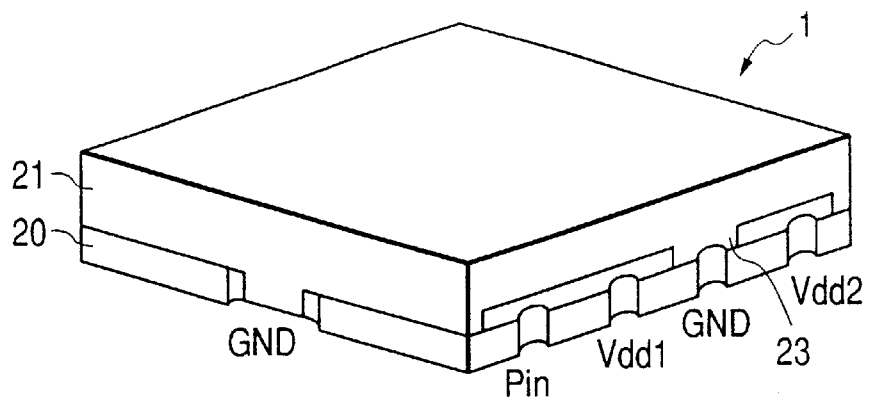
FIG. 3 is a perspective view showing an outward appearance of the high frequency power amplifier system according to the present [embodiment 1]

The high frequency power amplifier system (high frequency power amplifier module) 1 according to the present [embodiment 1] has a rectangular structure wherein as shown in a perspective view of FIG. 3, a cap 21 is superimposed over one surface side (main surface side) of a plate-shaped wiring substrate 20 and its outward appearance is flat.

The high frequency microwave amplifier system takes a module structure in which active parts such as transistors, etc. and inactive parts such as chip resistors, chip capacitors, etc. are mounted to one surface side of a wiring substrate having a multiple-layered structure, and a plurality of transistors are cascade-connected to form an amplifier having a multistage configuration. Further, the one surface side of the wiring substrate is covered with a metal cap which performs the role of an electromagnetic shielding effect. The cap is directly fixed to the wiring substrate and a package is constructed of the wiring substrate and the cap. Electrically independent external electrode terminals (electrode terminals) project from the package. Namely, surface-mounting external electrode terminals are provided at the peripheral edge of the lower surface of the wiring substrate in the present example. Incidentally, the wiring substrate may be formed as a structure wherein it supported by a support substrate and a cap is fixed to the support substrate.

Figure 2:
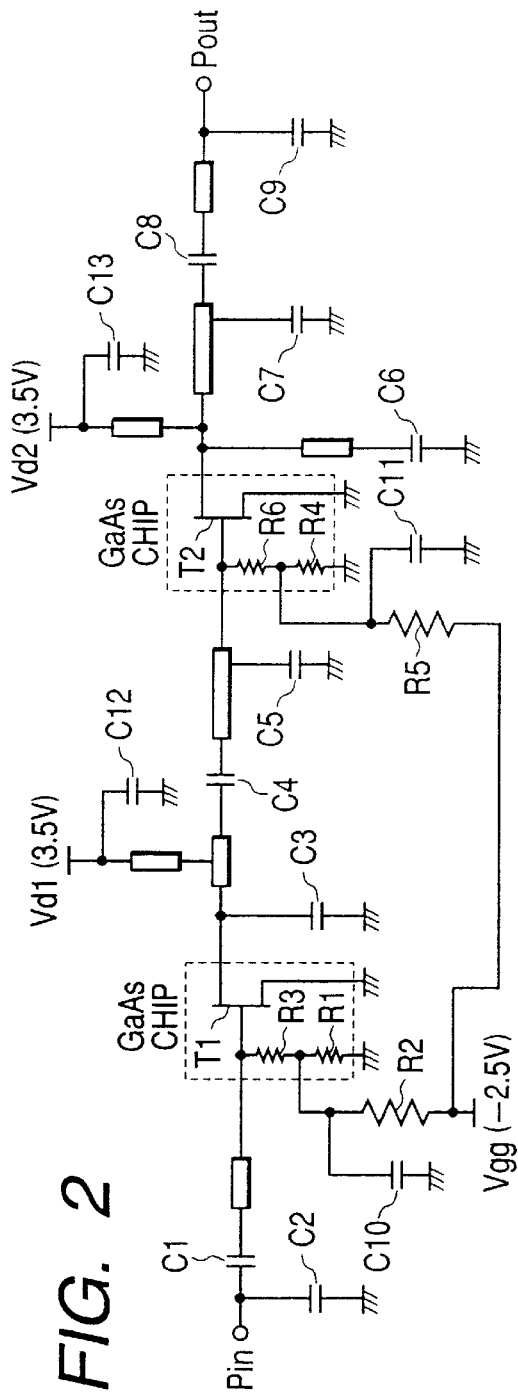
FIG. 2 is an equivalent circuit diagram of a high frequency microwave amplifier system illustrating one embodiment [embodiment 1] of the present invention.

The high frequency power amplifier module 1 according to the present [embodiment 1] constitutes a high frequency power module for a mobile communication system (portable telephone or handyphone system), wherein semiconductor chips each constituting HEMT are connected as active parts in multistage form on a circuit basis. In the present example, an amplifier having a two-stage configuration wherein two transistors (HEMT) are cascade connected, is used. FIG. 2 is an equivalent circuit diagram of the high frequency power amplifier module 1 according to the present [embodiment 1].

Incidentally, first reference potential terminals (Vdd[Vd1, Vd2] terminals) are voltage terminals fixed to a source potential (e.g., 3.5V). A gate bias terminal (Vgg terminal) is a voltage terminal fixed to a bias potential (e.g., −2.5V). Further, each transistor is of a depletion type wherein 0V is defined as a reference potential (Vref).

Figure 5:
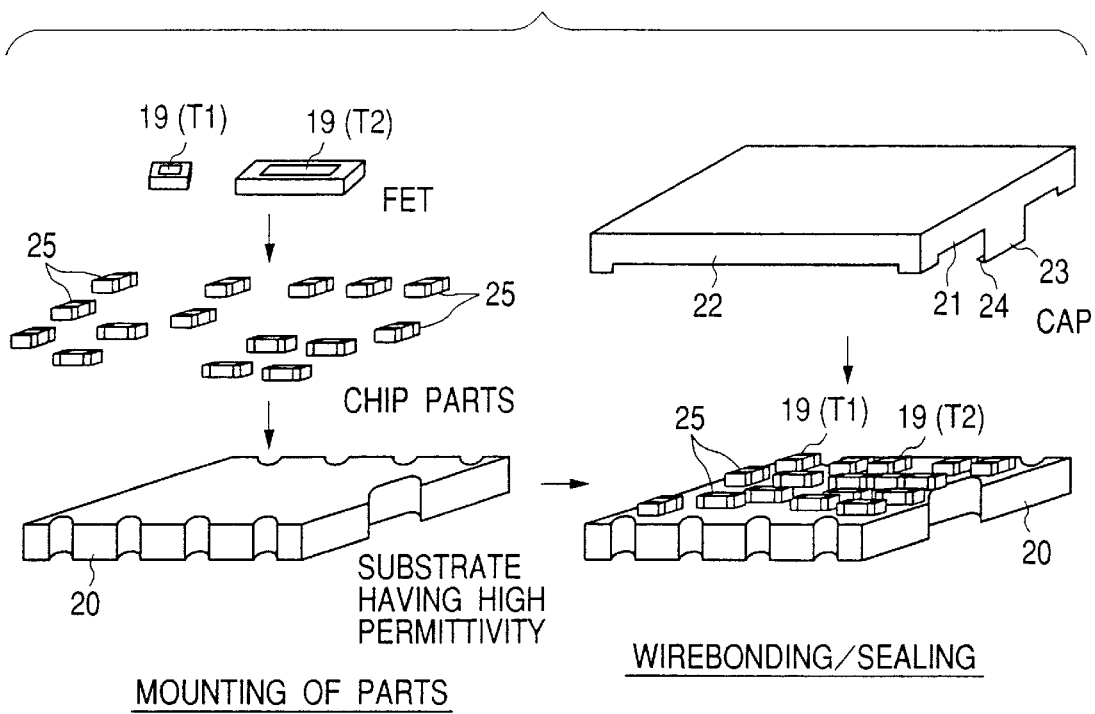
FIG. 5 is a schematic diagram for describing a state of assembly of the high frequency power amplifier system according to the present [embodiment 1]

The cap 21 has a structure wherein a metal plate is formed into a rectangular case by drawing as shown in FIG. 5 so that peripheral walls 22 projected along the peripheral edges of a lower surface thereof are provided. Notches are made to the peripheral walls 22 so that a plurality of hook arms 23 which elastically act on the sides of the wiring substrate 20, are provided. Projected hooks or hook nails 24, which are also formed by molding, are respectively provided inside leading ends of the hook arms 23. The hook nails 24 are respectively elastically hooked to unillustrated recessed hooking portions provided at the peripheral surface of the wiring substrate 20. By hooking the hook nails 24 to their corresponding hooking portions, the cap 21 is fixed to the wiring substrate 20 so that the flat high frequency power amplifier module 1 shown in FIG. 3 is obtained.

Further, the hook arms 23 are placed and constructed so as to be wetly connected to conductive jointing materials (solder) attached to grounding lands when each external electrode terminal on the back of the high frequency power amplifier module 1 is fixed to its corresponding land of a printed circuit board by melting the conductive jointing materials (solder). At this time, each of engagement portions, i.e., hooking portions of the wiring substrate 20 is provided with a ground interconnection (GND layer). The ground interconnection is also connected wetly to solder. Thus, the cap 21 brings about an electromagnetic shielding effect. Although a cross-sectional view of the wiring substrate 20 is not shown in the drawing in particular in the present [embodiment 1], the wiring substrate 20 has a multiple-layered structure.

Figure 4:
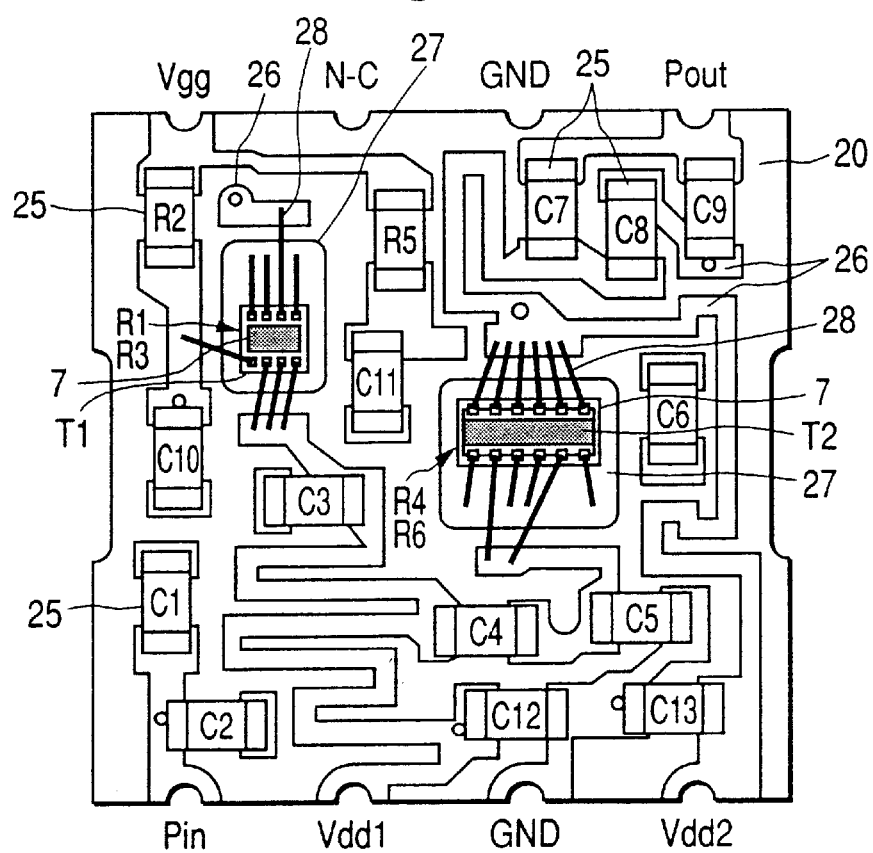
FIG. 4 is a plan view showing a state in which respective parts are mounted over a wiring substrate employed in the high frequency power amplifier system according to the present [embodiment 1]

As shown in FIGS. 4 and 5, chip parts 25, which constitute chip capacitors, chip resistors, etc., and transistors 7 are fixed to one surface (main surface) side of the wiring substrate 20. Electrode portions of the chip parts 25 are electrically connected to their corresponding interconnections 26 comprised of conductors through unillustrated conductive joiners such as solder or the like. The transistors 7 are electrically connected to their corresponding fixing portions 27 each comprised of a conductor formed over the main surface of the wiring substrate 20 by solder or the like.

The resistor R1 (15) and resistor R3 (18) on the high potential side shown in FIG. 1 are monolithically formed over each semiconductor chip 19 with each transistor 7 formed thereon. In the equivalent circuit and FIG. 4, the initial-stage transistor 7 (T1) is indicated or given by the resistors R1 and R3 on the high potential side, whereas the final-stage transistor 7 (T2) is indicated by resistors R4 and R6 on the high potential side. In the final-stage transistor 7, two resistors, which constitute a resistance type potential divider circuit, will be defined as R4 and R5. R4 is a resistor on the high potential side, whereas R5 is a resistor on the low potential side. R5 is electrically connected to Vgg. Further, the final-stage transistor and the initial-stage transistor are electrically connected to each other by a coupling capacitor C4. Resistors and capacitors are incorporated into the final-stage transistor and the initial-stage transistor to cut DC cut and fit impedance matching, etc.

As shown in FIG. 4, electrodes of the transistor 7 and each interconnection 26 are respectively electrically connected to one another by conductive wires 28. Although not shown in the drawing, the transistors 7, the wires 28, etc. are protected with being covered with an overcoat layer comprised of an insulative resin, and hence an improvement in moisture resistance therefor is achieved.

A description will next be made in brief of the wiring substrate 20 and electronic parts, etc. mounted on the wiring substrate 20. FIG. 4 is a plan view showing a state in which the respective parts are mounted over the wiring substrate. The high frequency power amplifier module 1 according to the present [embodiment 1] takes a structure wherein as shown in the plan view of the wiring substrate 20 in FIG. 4 and the equivalent circuit diagram of FIG. 2, the transistors (HEMT) T1 and T2 are cascade-connected so as to form an amplifier having a two-stage configuration.

As shown in FIG. 4, external electrode terminals are partly provided over the wiring substrate 20 so as to extend from the peripheral edges of the wiring substrate 20 to its lower surface. The external electrode terminals include an input terminal (Pin), an output terminal (Pout), a control terminal (Vgg), voltage terminals (Vdd1, Vdd2), and ground terminals (GND). These terminals are provided with conductors (interconnections 26 and fixing portions 27) formed in predetermined patterns. Further, respective electronic parts are mounted on the wiring substrate and necessary portions are electrically connected to one another by their corresponding wires 28.

Namely, the respective parts are mounted as shown in FIG. 4 so as to meet the equivalent circuit shown in FIG. 2. In these drawings, symbols T1 and T2 indicate transistors, symbols C1 through C13 indicate chip capacitors, and symbols R2 and R5 indicate chip resistors, respectively. Slender rectangular portions shown in FIG. 2 indicate microstrip lines.

The wiring substrate 20 is composed of a low-temperature calcined wiring substrate formed by stacking, for example, glass ceramics on each other. Interconnections make use of a high conductive metal such as a silver metal. Namely, each outer layer interconnection makes use of Ag-Pt, and each internal interconnection utilizes Ag. The low-temperature calcining is carried out at a temperature of about 600° C. and is capable of using Ag low in melting point. Since Ag serves as a high conductive metal low in resistance value, an improvement in high frequency characteristic can be achieved.

FIG. 5 is a diagram schematically showing a state in which respective parts (semiconductor chips 19 and chip parts 25 are mounted over a main surface of a wiring substrate 20 and a state in which wire bonding and sealing are carried out.

Figure 6:
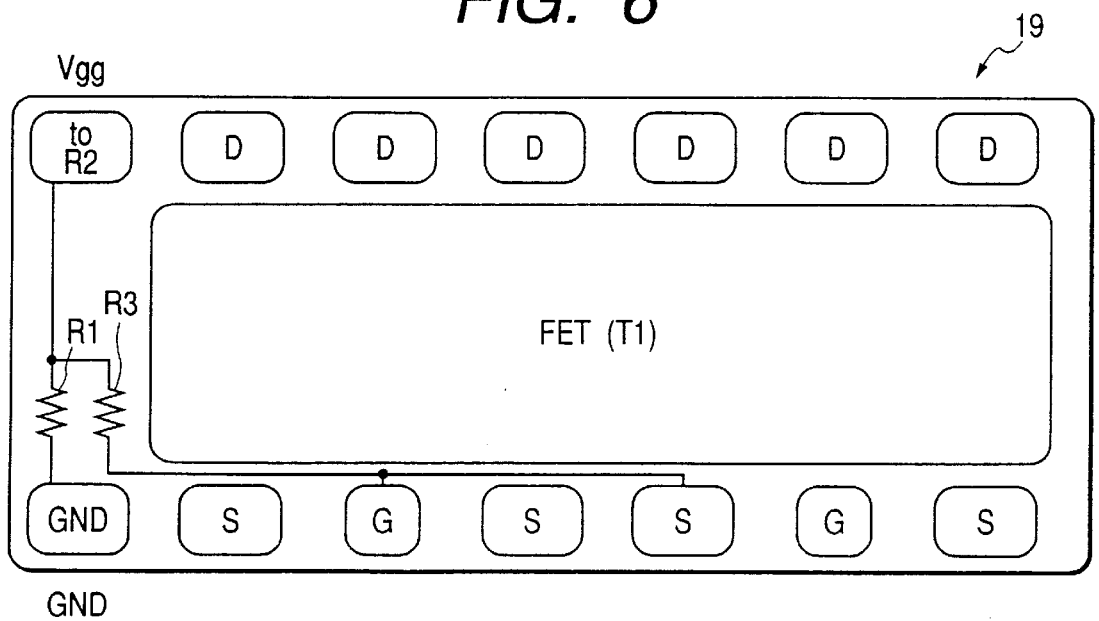
FIG. 6 is a schematic plan view showing a semiconductor device built in the high frequency power amplifier system according to the present [embodiment 1]
Figure 7:
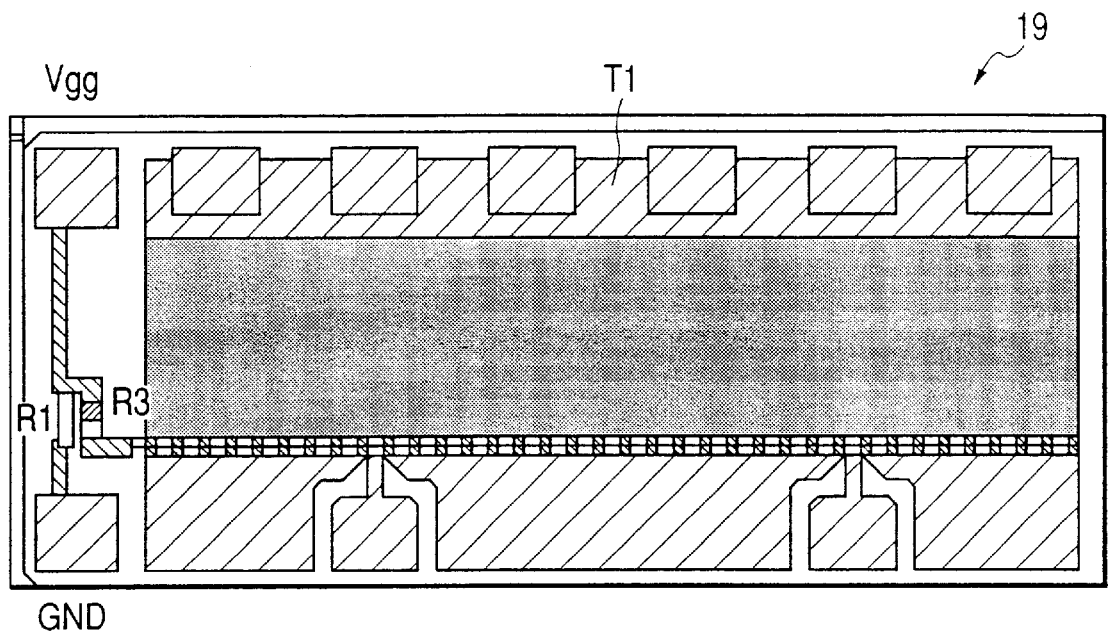
FIG. 7 is a schematic plan view illustrating electrode patterns and the like of the semiconductor device.

The semiconductor chips 19 will now be explained in brief. FIG. 6 is a schematic plan view of a semiconductor chip (semiconductor device), and FIG. 7 is a schematic plan view showing electrode patterns and the like of the semiconductor device, respectively.

Figure 8:
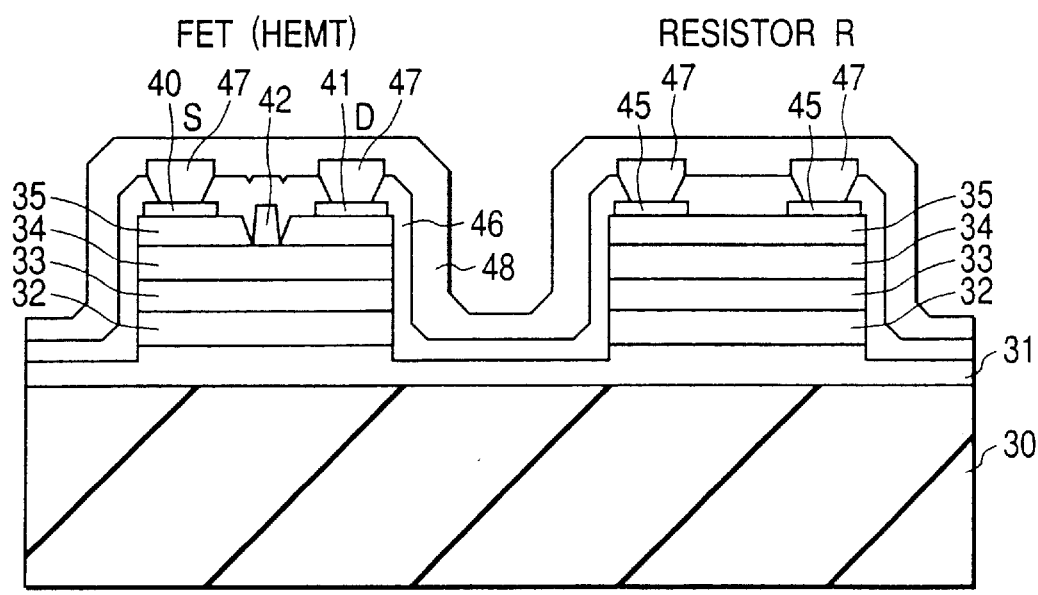
FIG. 8 is a schematic cross-sectional view showing a part of the semiconductor device.

This is an example in which resistors R1 and R3 are formed over the semiconductor chip 19. A transistor is of HEMT and its sectional structure is illustrated in FIG. 8. FIG. 8 is a schematic cross-sectional view of a part of the semiconductor chip 19 and is a cross-sectional view of HEMT.

The semiconductor chip 19 is formed with a semiconductor substrate 31 as a base. Namely, buffer layers 32, electron supply layers 33, channel layers 34, electron supply layers 35 and cap layers 36 are successively formed over a main surface of the semiconductor substrate 31 composed of a chemical compound by epitaxial growth. These multi-layered semiconductor layers are isolated (separated for insulation) by etching grooves and are comprised of transistors (HEMT) portions and resistor R portions respectively.

These respective portions are formed of, for example, the following semiconductor. The semiconductor substrate 31 is comprised of a semi-insulating GaAs substrate. The buffer layers 32 are formed of undoped AlGaAs, the electron supply layers 33 are formed of N+ type AlGaAs, the channel layers 34 are formed of undoped InGaAs, the electron supply layers 35 are formed of N type AlGaAs, and the cap layers 36 are formed of N+ type GaAs, respectively. It is not necessary to provide each electron supply layer 33.

In the HEMT portion, each cap layer 36 is etched along the center thereof and etched to determine a characteristic of HEMT, whereby the thickness of each electron supply layer 35 is determined. Electrodes are respectively provided over the cap layers 36 on both sides of a recess. One of the electrodes serves as a source electrode (S) 40, whereas the other thereof serves as a drain electrode (D) 41. Further, a gate electrode (G) 42 is provided at the recess portion.

No recess is provided in the resistor R portion, and two electrodes (SD) 45 for each resistor are simultaneously provided upon formation of the source electrode and drain electrode.

The surfaces of the HEMT portion and resistor R portion are covered with an interlayer dielectric 46. The interlayer dielectric 46 is partly provided with contact holes. Interconnections 47 each having a predetermined pattern are formed over the interlayer dielectric 46 and in the contact holes and serve as interconnections for drawing respective electrodes. Further, the entire region on the main surface side of the semi-insulating GaAs substrate 31 is covered with an insulative passivation film 48 except for pads for wire bonding.

Thus, since the transistor and resistor are monolithically formed, they become identical in temperature coefficient to each other. In the case of GaAs, the temperature coefficient assumes a positive temperature coefficient and hence results in about 0.12%/° C.

Owing to the monolithism, the number of parts can be reduced and a reduction in the size of the high frequency power amplifier module 1 can be also achieved. The side reduction of the high frequency power amplifier module 1 leads to a reduction in the size of electronic equipment with the high frequency power amplifier module built therein.

Namely, a wireless communication system such as a handyphone system with the high frequency power amplifier module 1 incorporated therein can be also reduced in size.

The present [embodiment 1] can be constructed as a high frequency power module wherein the transistors are assembled in two-stage form and which is suitable for a handyphone system whose frequency ranges from 800 MHz to 1000 MHz as well as from 1.4 GHz to 1.9 GHz.

Figure 9:
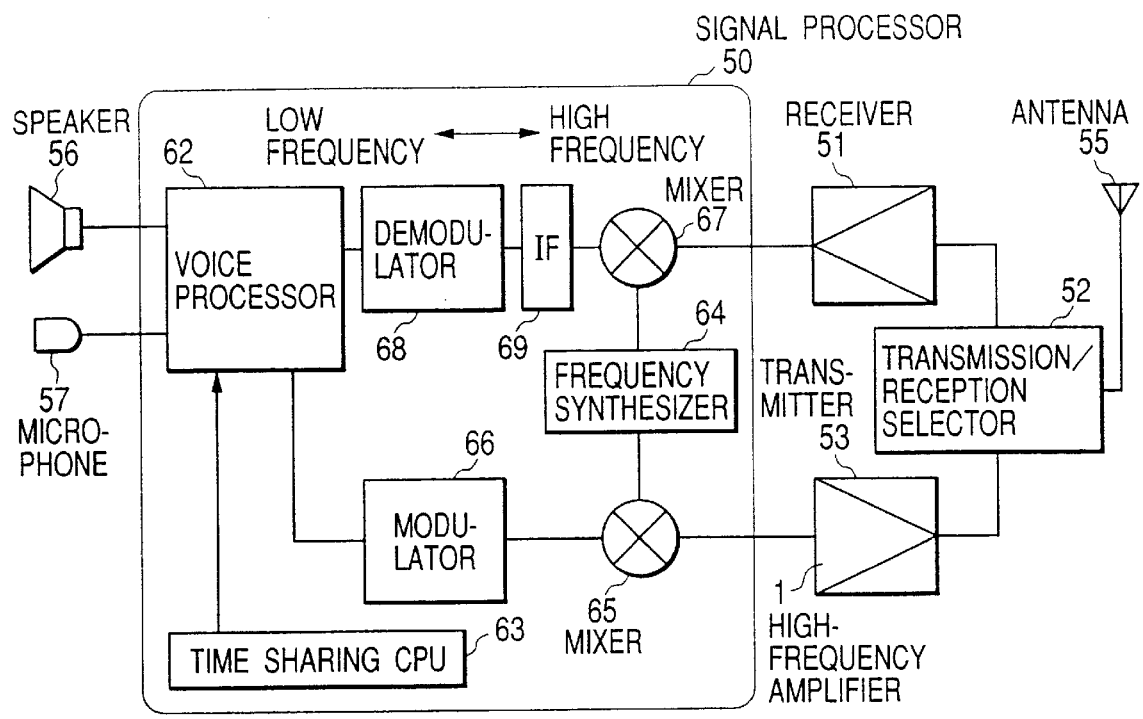
FIG. 9 is a block diagram illustrating a part of a wireless communication system (portable telephone) in which the high frequency power amplifier system according to the present [embodiment 1] is built.
Figure 10:
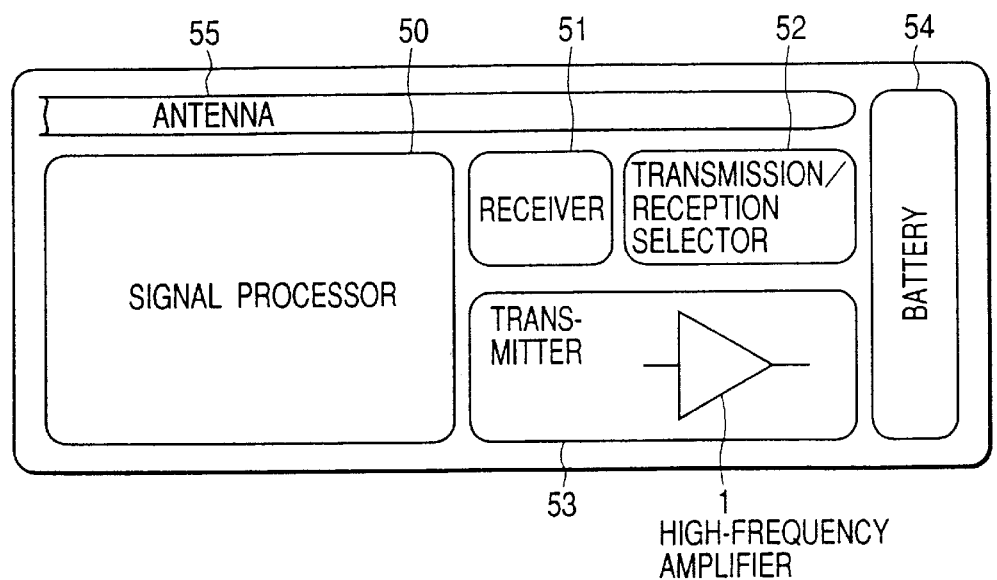
FIG. 10 is a schematic diagram depicting a part of the wireless communication system (portable telephone) in which the high frequency power amplifier system according to the present [embodiment 1] is incorporated.

FIG. 9 is a block diagram of a mobile communication system (handyphone system) with the high frequency power amplifier module 1 according to the present [embodiment 1] incorporated therein. FIG. 10 is a schematic diagram showing a part of the same handyphone system. As shown in FIG. 10, the handyphone system has a signal processor 50, a receiver 51, a transmission/reception selector 52, a transmitter 53, a battery 54, and an antenna 55. The transmitter 53 has the high frequency power amplifier module (amplifier) 1 incorporated therein.

As shown in FIG. 9, the signal processor 50 includes a voice processor 62 to which a speaker 56 and a microphone 57 are connected, and a CPU 63 for controlling the voice processor 62.

Further, a transmission system is constructed so as to have a mixer 65 connected to the high frequency power amplifier module 1 of the transmitter 53 and controlled by a frequency synthesizer 64, and a modulator 66 installed between the mixer 65 and the voice processor 62. Furthermore, a reception system is constructed so as to have a mixer 67 connected to the receiver 51 and controlled by the frequency synthesizer 64, and a demodulator 68 and an IF 69 successively installed between the voice processor 62 and the mixer 67.

In such a handyphone system, a reduction in idle current of the high frequency power amplifier module 1 makes it possible to improve the efficiency of operation thereof and achieve less power consumption. As a result, the life for the battery becomes long. Further, a call time interval per unit battery also becomes long.

According to the present [embodiment 1], the following effects can be brought about:

(1) In the high frequency power amplifier module (high frequency power amplifier system) 1 with the transistors incorporated therein in multistage form, the resistors on the high potential sides, of the resistance type potential divider circuits (bias circuits) connected to their corresponding control terminals of the respective transistors are respectively set as the temperature compensating resistors whose resistance values vary linearly. Therefore, when the temperature rises, the resistance values of the temperature compensating resistors successively increase and the potential at each control electrode becomes low relatively, whereby an idle current-temperature characteristic is rendered negative. As a result, distortion in a compensation temperature entire region is less reduced so that an improvement in distortion characteristic can be achieved.

Figure 12:
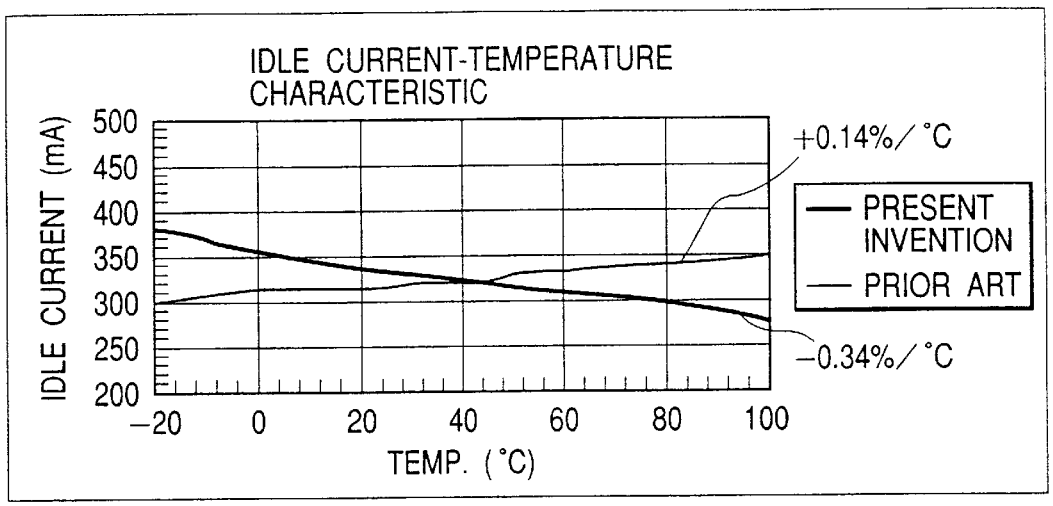
FIG. 12 is a graph illustrating an idle current-temperature characteristic of the portable telephone according to the present [embodiment 1]

FIG. 12 is a graph showing an idle current vs. temperature characteristic of the handyphone system according to the present [embodiment 1]. As is understood from the same graph, the idle current vs. temperature characteristic has a positive temperature coefficient (±0.14%/° C.) in the conventional example, whereas according to the present [embodiment 1], it has a negative temperature coefficient (−0.34%/° C.).

Figure 13:
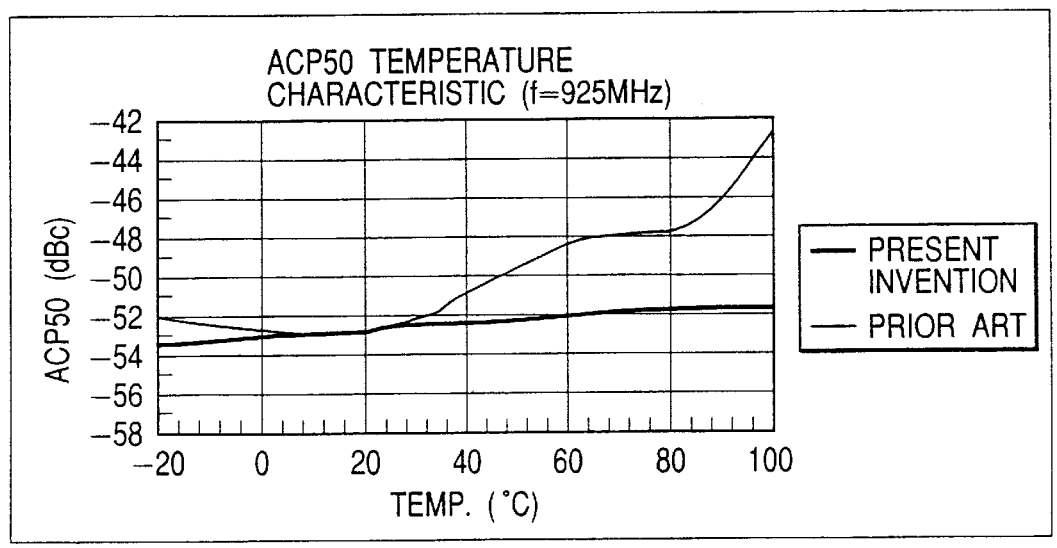
FIG. 13 is a graph depicting adjacent channel leakage power (ACP50 temperature characteristic) of the portable telephone according to the present [embodiment 1]
Figure 14:
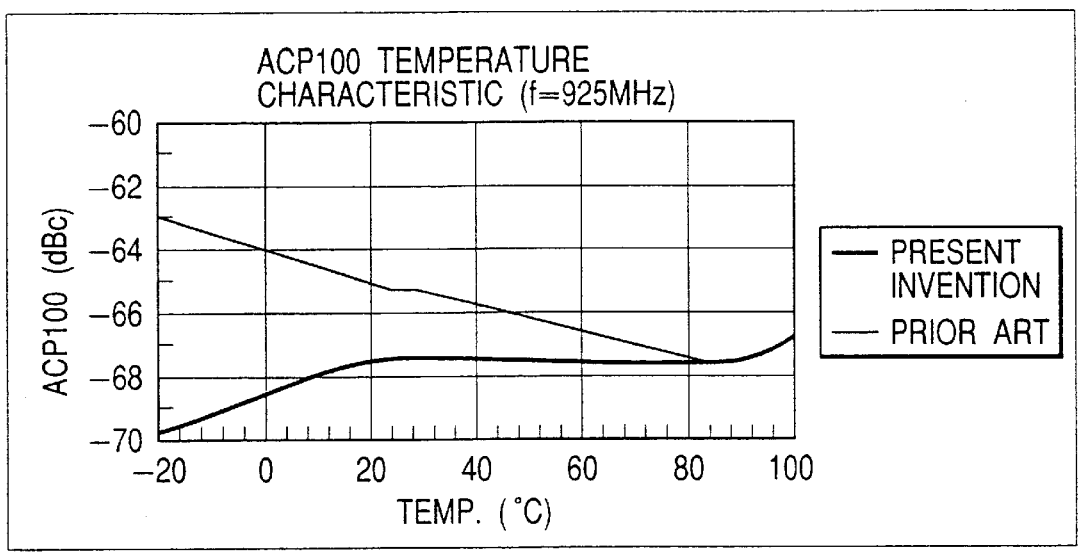
FIG. 14 is a graph showing adjacent channel leakage power (ACP100 temperature characteristic) of the portable telephone according to the present [embodiment 1]
Figure 15:
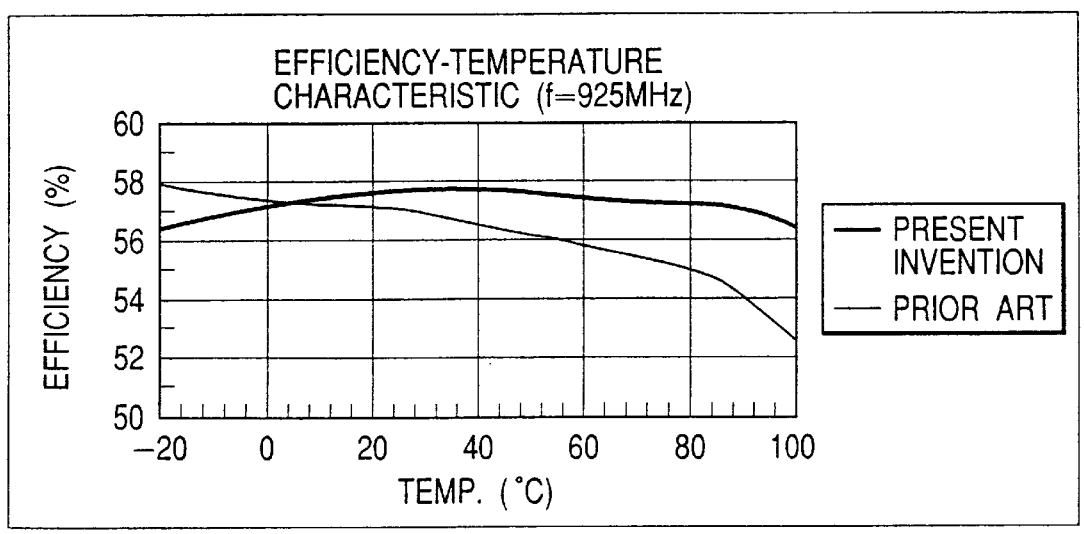
FIG. 15 is a graph illustrating the correlation between the efficiency and temperature of the portable telephone according to the present [embodiment 1]

(2) Owing to a reduction in idle current, adjacent channel leakage power ACP can be controlled low and an increase in efficiency is also made possible. FIGS. 13 and 14 are respectively graphs showing adjacent channel leakage power (ACP50 temperature characteristic and ACP100 temperature characteristic) of the handyphone system according to the present [embodiment 1]. FIG. 15 is a graph showing the correlation between the efficiency and temperature of the handyphone system according to the present [embodiment 1].

As is understood from the same graph, changes in adjacent channel leakage power ACP can be controlled low in either case, and both indicate low numerical values. As a result, an increase in efficiency can be achieved. Owing to the lowering of each numerical value, a characteristic test can be also changed to a manufacturing system for performing a sampling test on some of parts as an alternative to one hundred percent test carried out when the upper limit thereof is close to the standardized upper limit. Therefore, the testing cost of the high frequency power amplifier module 1 can be also reduced.

Figure 16:
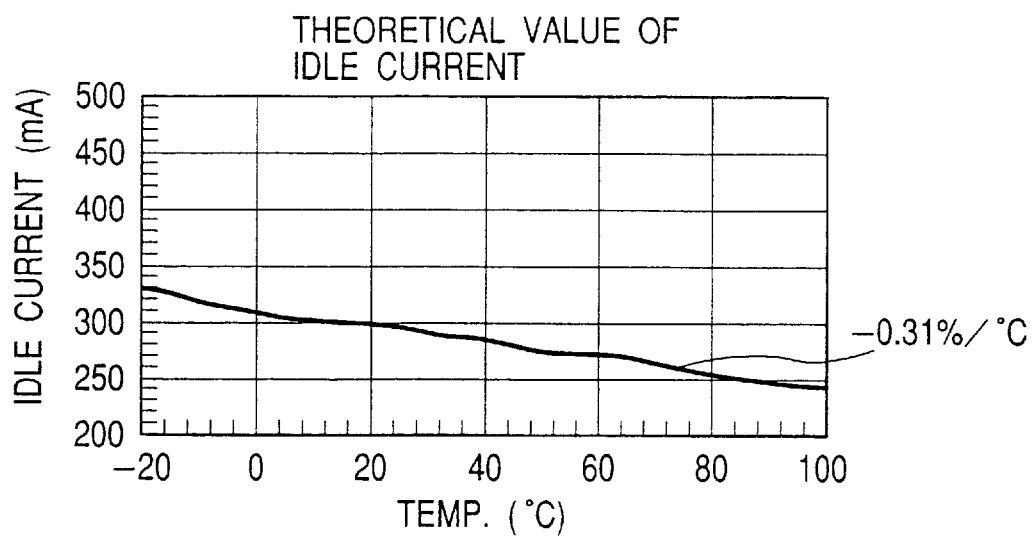
FIG. 16 is a graph based on theoretical values, depicting the correlation between the temperature and idle current of the portable telephone according to the present [embodiment 1]

FIG. 16 is a graph based on theoretical values, showing the correlation between the temperature and idle current of the handyphone system according to the present [embodiment 1]. It is understood that the present graph substantially coincides with the graph according to the present invention, which is shown in FIG. 12.

(3) In the bias circuits of the initial-stage (input stage) and final-stage (output stage) semiconductor amplifying devices, the resistors on the high potential sides of the resistance type potential divider circuits may simply be set as the temperature compensating resistors respectively. Therefore, the attachment of other parts for the purpose of making the drain current constant as in the conventional example, etc. become unnecessary, and hence the manufacturing cost of the high frequency power amplifier system can be reduced due to a reduction in the number of parts and a reduction in the number of assembly manhours.

(4) Since each temperature compensating resistance referred to above is monolithically formed over the semiconductor substrate used to form each transistor, the high frequency power amplifier system can be brought into less size as compared with the structure wherein the resistors on the high potential sides are assembled as chip resistors respectively.

(5) In the handyphone system in which the high frequency power amplifier module 1 according to the present [embodiment 1] has been incorporated, an improvement in distortion characteristic, an increase in efficiency, a size reduction and a reduction in manufacturing cost can be achieved owing to the fact that the temperature coefficient is brought to the negative temperature coefficient of the idle current-temperature characteristic. In particular, a reduction in power consumption can be achieved owing to the improvement in efficiency. As a result, a call time interval can be made long and the battery can be brought into less size. The size reduction of the battery allows further multifunctioning and size reduction of a wireless communication system.

Incidentally, the structure in which the resistor on the high potential side of each resistance type potential divider circuit is set as the temperature compensating resistance, may be set to only at least the initial-stage semiconductor amplifying device. In this case, the initial stage takes a class-A amplifying configuration. Further, an output stage is used as for class-AB amplification and semiconductor amplifying devices of other stages inclusive of the initial stage may be set to the class-A amplification. Effects similar to the aforementioned embodiments can be obtained even in the case of these respective configurations. An amplifier circuit operates in a saturation region and a non-saturation region. Namely, if an input is given within a point where a load line and an IV curve intersect as shown in FIG. 11, then it operates in a non-saturation region.

[Embodiment 2]

Figure 17:
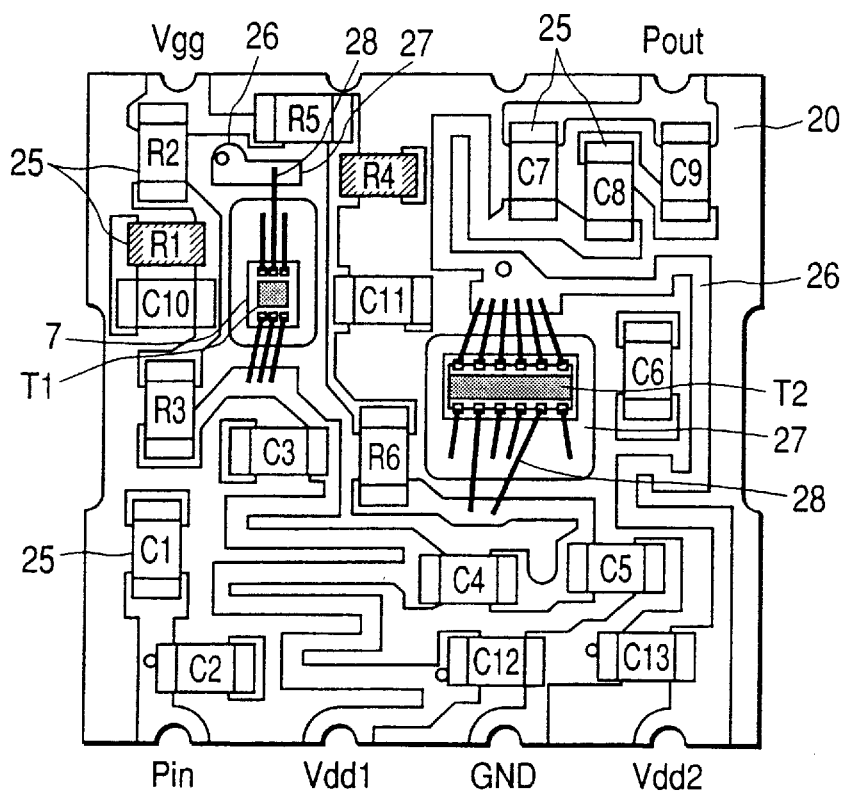
FIG. 17 is a plan view showing a state in which respective parts are mounted over a wiring substrate employed in a high frequency microwave amplifier system showing another embodiment [embodiment 2] of the present invention.

FIG. 17 is a diagram related to a high frequency microwave amplifier system showing another embodiment [embodiment 2] of the present invention. FIG. 17 is a plan view showing a state in which respective parts are mounted over a wiring substrate employed in the high frequency microwave amplifier system, FIG. 18 is a perspective view illustrating a temperature compensating resistor incorporated into the high frequency microwave amplifier system, and FIG. 19 is a schematic cross-sectional view showing the temperature compensating resistor, respectively.

The present [embodiment 2] shows an example in which temperature compensating resistors R1 and R4 on the high potential side of a resistance type potential divider circuit are used as chip resistors respectively.

Figure 18:
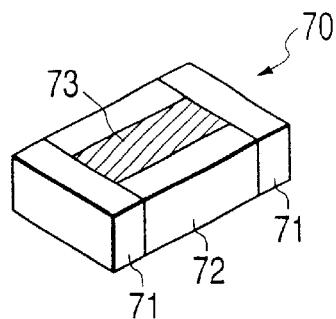
FIG. 18 is a perspective view illustrating a temperature compensating resistor incorporated into the high frequency microwave amplifier system according to the present [embodiment 2]
Figure 19:
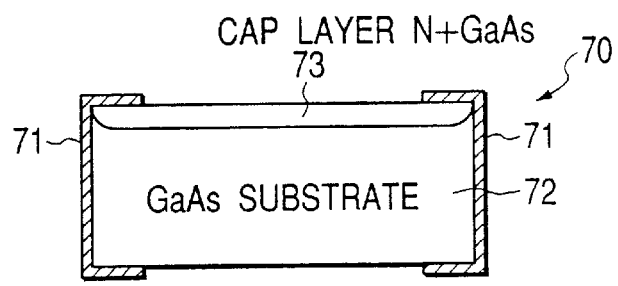
FIG. 19 is a schematic cross-sectional view showing the temperature compensating resistor employed in the present [embodiment 2]

A temperature compensating chip resistor 70 takes a rectangular body shaped in the form of a rectangle as shown in FIG. 18 and has electrodes 71 provided at both ends thereof. As shown in FIGS. 18 and 19, the temperature compensating chip resistor 70 has an insulating substrate 72, a conductor 73 whose resistance value varies linearly depending on the temperature, which is formed over at least the whole surface of the insulative substrate 72, the electrode 71 electrically connected to one end of the conductor 73, and the electrode 71 electrically connected to the other end of the conductor 73. The conductor 73 is formed of any of silicon, GaAs and Germanium. Namely, a material having a positive temperature coefficient is used for the conductor 73.

In the present [embodiment 2], a semi-insulating GaAs substrate is used as the insulating substrate 72, and the conductor 73 is formed by a semiconductor region formed by diffusing an impurity into the whole surface of the semi-insulating GaAs substrate.

Incidentally, the temperature compensating chip resistor 70 can be manufactured even by a method of printing conductors on the insulative substrate 72 and calcining same. These conductors are characterized by linear changes in resistance value and different from those indicative of exponential characteristics as in the case of a thermistor.

According to the present [embodiment 2], it has effects substantially similar to those obtained in the aforementioned [embodiment 1].

According to the present [embodiment 2] as well, since the temperature compensating resistor is comprised of a single electronic part, an improvement in distortion characteristic, an increase in efficiency, a size reduction owing to the elimination for the need of attachment of other parts, and a reduction in manufacturing cost can be achieved.

(Embodiment 2)

Figure 20:
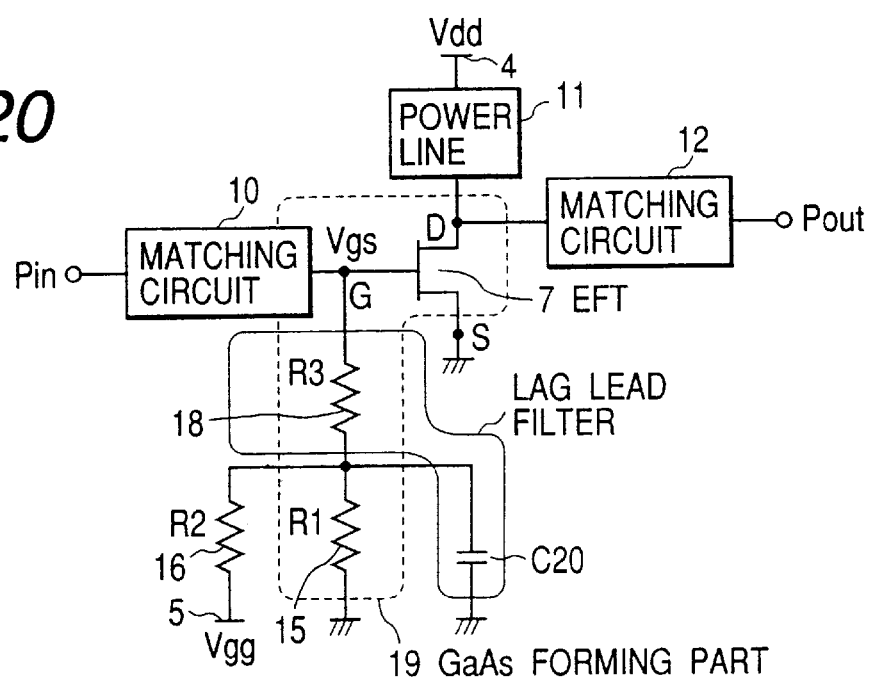
FIG. 20 is an equivalent circuit diagram of a high frequency power amplifier system showing another embodiment (embodiment 2) of the present invention.

FIG. 20 is an equivalent circuit diagram of a high frequency power amplifier system showing another embodiment (embodiment 2) of the present invention.

The present (embodiment 2) is equivalent to one wherein a resistor R3 used as a temperature compensating resistor and a capacitor C20 constitute a lag lead filter in the aforementioned [embodiment 1]. Even in the case of this (embodiment), a transistor and resistors R1 and R3 are monolithically formed.

According to the present (embodiment 2), since the lag lead filter comprised of the resistor and the capacitor is incorporated in each control electrode, control on oscillations can be achieved. Further, since the resistor constituting the lag lead filter is used as the temperature compensating resistor, no harm occurs in a change in potential applied to the control electrode. Since the resistor constituting the lag lead filter is also monolithically formed over a semiconductor substrate with the transistor formed thereon, the high frequency power amplifier system can be prevented from increasing in size.

(Embodiment 3)

Figure 21:
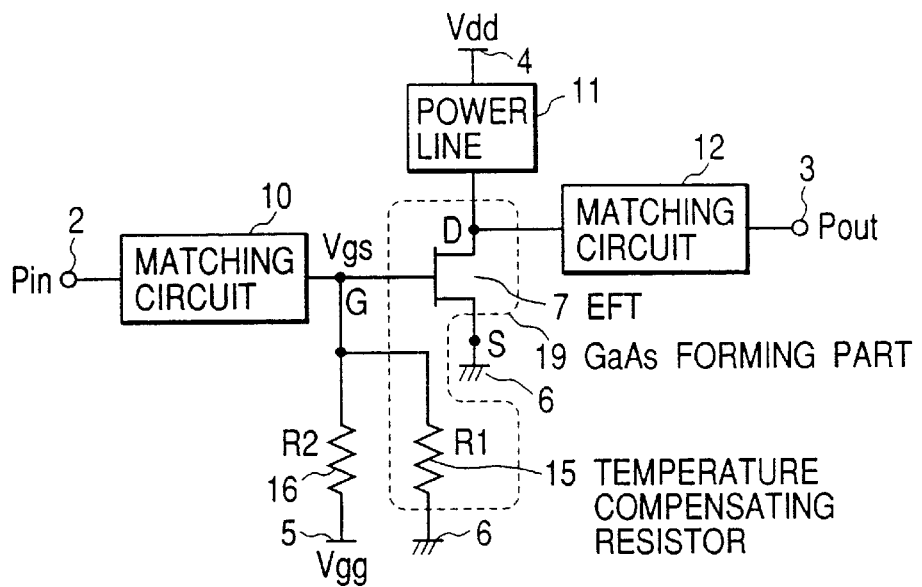
FIG. 21 is an equivalent circuit diagram of a high frequency power amplifier system illustrating a further embodiment (embodiment 3) of the present invention.
Figure 22:
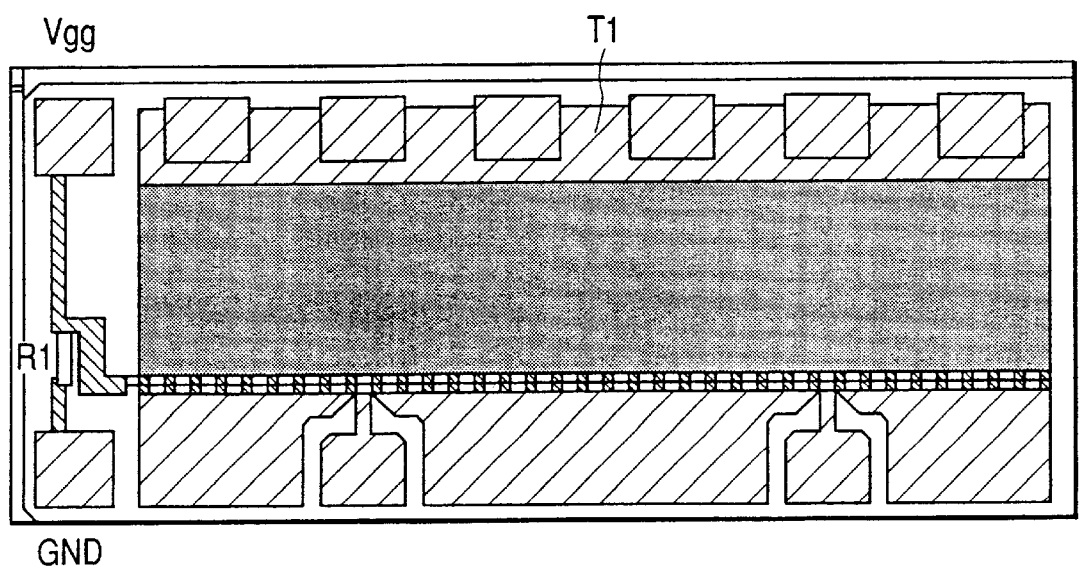
FIG. 22 is a schematic plan view showing electrode patterns and the like of a semiconductor device incorporated in a high frequency power amplifier system according to an [embodiment 3] specifically illustrative of the (embodiment 3)

FIG. 21 is an equivalent circuit diagram of a high frequency power amplifier system illustrating a further embodiment (embodiment 3) of the present invention, and FIG. 22 is a diagrammatic plan view showing electrode patterns and the like of a semiconductor device incorporated in a high frequency power amplifier system according to an [embodiment 3] specifically illustrative of the (embodiment 3).

The present (embodiment 3) and the [embodiment 3] respectively show an example in which only the resistor R1 of the resistance type potential divider circuit connected to the control electrode is incorporated into the semiconductor chip 19. The present example can also bring about the effects obtained in the aforementioned (embodiment 1) and the [embodiment 1].

(Embodiment 4)

Figure 23:
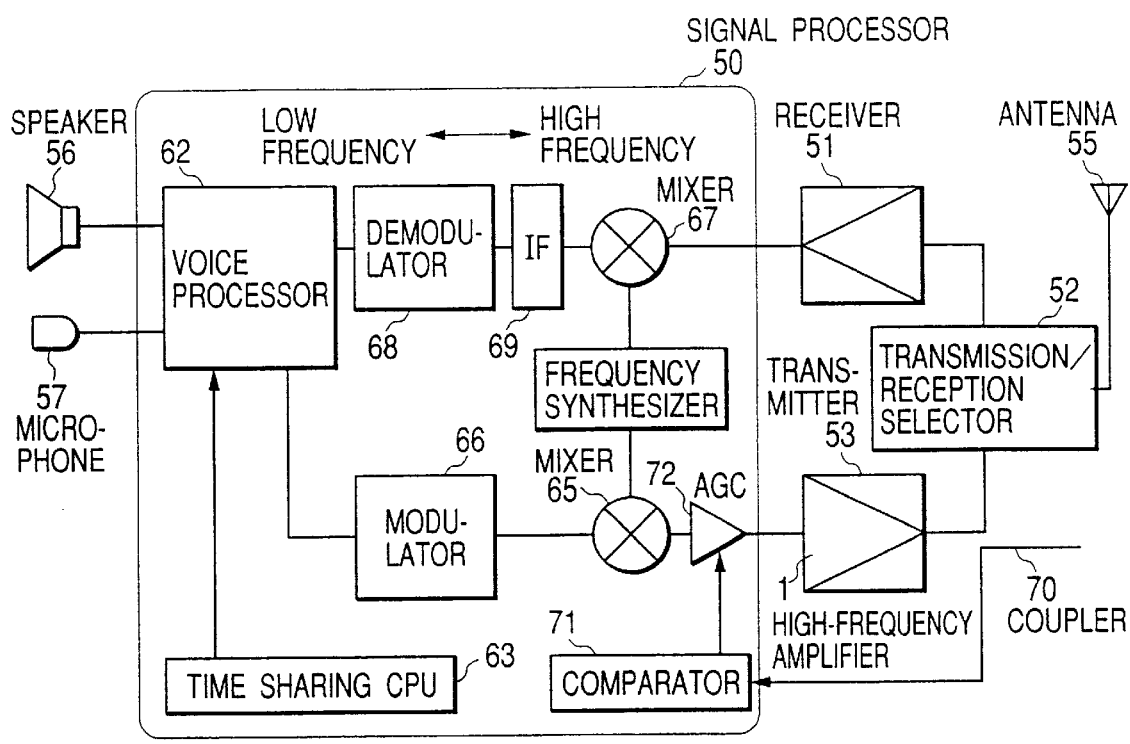
FIG. 23 is a block diagram illustrating a part of a wireless communication system (portable telephone) according to a further embodiment (embodiment 4) of the present invention.

FIG. 23 is a block diagram showing a part of a wireless communication system (handyphone system) illustrating a further embodiment (embodiment 4) of the present invention. The present (embodiment 4) relates to a wireless communication system equipped with input power control (AGC: Automatic Gain Control) means. A linear amplifier produces distortion when an operating point (bias point) is shifted. Therefore, the operating point is fixed and output power is corrected under the control of input power to thereby prevent the distortion from occurring.

Referring to FIG. 23 while compared with the block diagram of FIG. 9, a coupler 70 detects an output produced from a high frequency power amplifier system 1 of a transmitter 53, and a comparator 71 performs a comparison on information detected from the coupler 70 and sends a signal outputted from the comparator 71 to an input power control (AGC) 72. The AGC 72 corrects output power, based on the signal outputted from the comparator 71 and thereby controls the generation of distortion.

(Embodiment 5)

Figure 24:
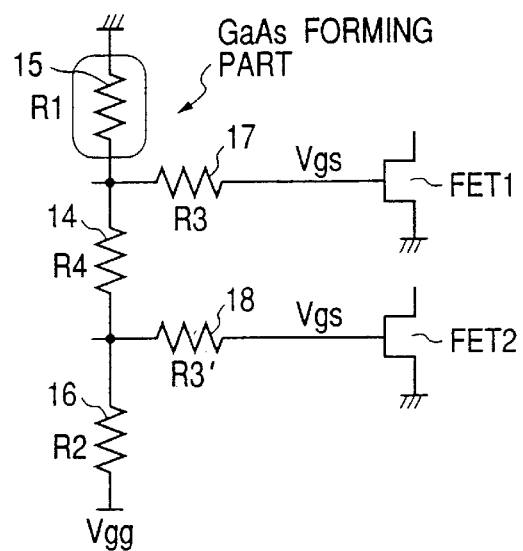
FIG. 24 is a circuit diagram showing another example of a bias circuit of a semiconductor amplifying device employed in a high frequency power amplifier system illustrating a still further embodiment (embodiment 5) of the present invention.
Figure 25:
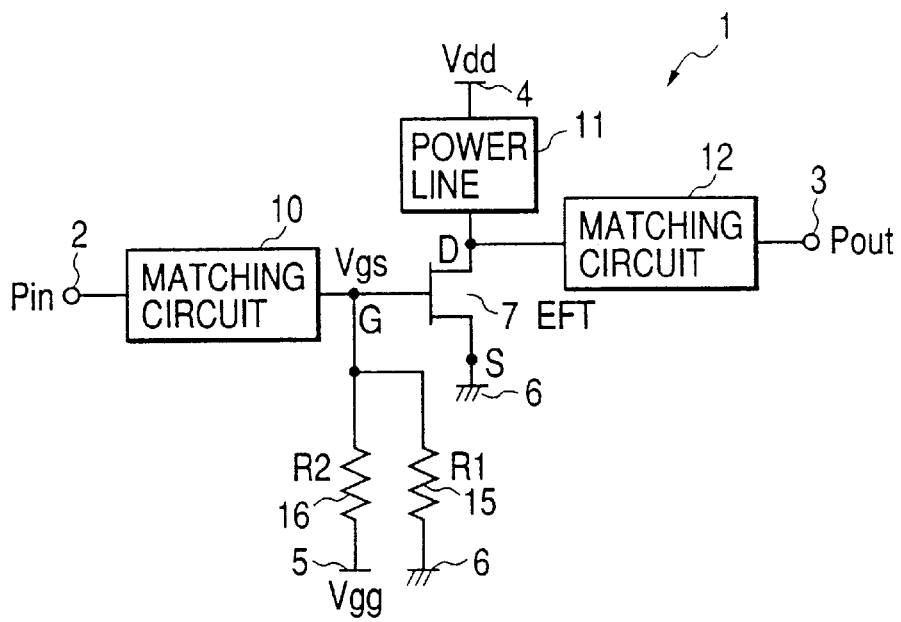
FIG. 25 is an equivalent circuit diagram of a conventional high frequency power amplifier system.
Figure 26:
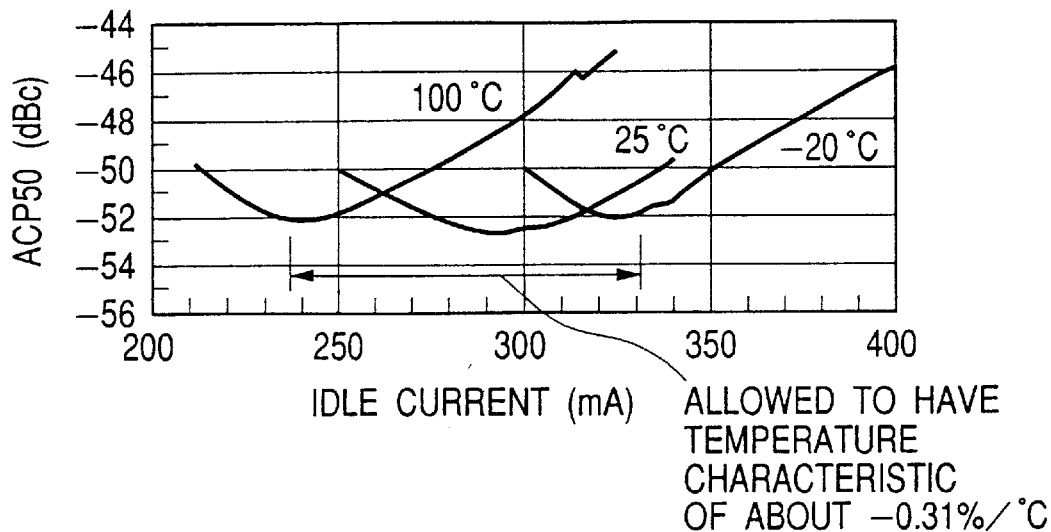
FIG. 26 is a graph showing the correlation between idle current and adjacent channel leakage power obtained from experiments carried out by the present inventors and others.

FIG. 24 is a circuit diagram showing another example of a bias circuit of a semiconductor amplifying device employed in a high frequency power amplifier system 1 illustrating a still further embodiment (embodiment 5) of the present invention. The present embodiment 5 adopts a structure wherein a resistor 14 is electrically series-connected between a resistor R1 (15) on the high potential side, of a resistance type potential divider circuit of the bias circuit and a resistor R2 (16) thereof on the low potential side, a resistor 17 is electrically series-connected between a portion where the resistors 15 and 14 are electrically connected, and a control terminal Vgs of a transistor (FET1), and a resistor 18 is electrically series-connected between a portion where the resistors 14 and 16 are electrically connected, and a control terminal Vgs of a transistor (FET2). Of these resistors, the resistor 15 is monolithically formed on a semi-insulating GaAs substrate used to form each FET and set as a temperature compensating resistor, whereas other resistors are formed by externally-provided parts such as chip resistors or the like non-dependent on the temperature.

While effects similar to those obtained in the aforementioned (embodiment 1) are obtained even by the present (embodiment 5), it is necessary to provide the resistor 14 (R4) for the purpose of setting FET1 and FET2 to individual biases. Thus, temperature compensation sensitivity of FET2 is liable to decrease.

While the invention made by the present inventors as described above has been described specifically by the embodiments, the present invention is not necessarily limited to the embodiments. It is needless to say that various changes can be made thereto within the scope not departing from the substance thereof.

Advantageous effects obtained by typical ones of the inventions disclosed in the present application will be described in brief as follows:

(1) Since a resistor on the high potential side, of a resistance type potential divider circuit connected to a control electrode of a transistor is constructed of a temperature compensating resistor whose resistance value varies linearly, the potential applied to the control electrode is reduced with an increase in temperature and an idle current is lowered, whereby a distortion characteristic is improved.

(2) Efficiency is improved owing to the reduction in idle current.

(3) Since a resistor on the high potential side, of a resistance type potential divider circuit is simply constructed as a temperature compensating resistor whose resistance value varies linearly, to make a drain current constant, it is unnecessary to provide many individual parts as in the prior art, and the number of parts can be reduced.

(4) A reduction in manufacturing cost of a high frequency power amplifier system can be achieved owing to a reduction in the number of parts and a reduction in the number of assembly manhours with the reduction in the number of the parts.

(5) The high frequency power amplifier system can be brought into less size due to the reduction in the number of the parts.

(6) Owing to the reduction in idle current employed in a high frequency power amplifier system, a wireless communication system with the high frequency power amplifier system built therein can achieve a reduction in power consumption. Thus, the wireless communication system can achieve an improvement in distortion characteristic, an increase in efficiency, a size reduction and a reduction in manufacturing cost. In particular, a reduction in power consumption can be achieved owing to the improvement in efficiency. As a result, a call time interval can be made long and a battery can be brought into less size. The size reduction of the battery allows further multifunctioning and size reduction of the wireless communication system.

What is claimed is:

1. A high frequency power amplifier system, comprising:
   an input terminal;
   an output terminal;
   a bias terminal supplied with a bias voltage;
   a first semiconductor amplifying device having a control electrode connected to said input terminal and a first electrode which outputs a signal corresponding to a signal supplied to said input terminal;
   a second semiconductor amplifying device having a control electrode which receives a signal based on the signal outputted from said first electrode of said first semiconductor amplifying device, and a first electrode which supplies a signal corresponding to the signal supplied to said control electrode to said output terminal;
   a first resistance type potential divider circuit connected to said bias terminal and which supplies a bias voltage to the control electrode of said first semiconductor amplifying device;
   wherein a first resistor for voltage division, included in said first resistance type potential divider circuit is formed over the same semiconductor chip as said first semiconductor amplifying device, and a second resistor for voltage division is separated from said semiconductor chip;
   wherein said second resistor is provided between said bias terminal and said control electrode of said first semiconductor amplifying device, and said first resistor is provided between said control electrode of said first semiconductor amplifying device and a predetermined potential point; and
   further including a second resistance type potential divider circuit connected to said bias terminal and for supplying a bias voltage to the control electrode of said second semiconductor amplifying device, and
   wherein a third resistor for voltage division, included in said second resistance type potential divider circuit is formed over the same semiconductor chip as said second semiconductor amplifying device, and a fourth resistor for voltage division is separated from said semiconductor chip.

2. The high frequency power amplifier system according to claim 1, wherein said first semiconductor amplifying device performs class-A amplifying operation.

3. A wireless communication system comprising:
   a high frequency power amplifier apparatus, which includes:
   an input terminal;
   an output terminal;
   a bias terminal supplied with a bias voltage;
   a first semiconductor amplifying device having a control electrode connected to said input terminal and a first electrode which outputs a signal corresponding to a signal supplied to said input terminal;
   a second semiconductor amplifying device having a control electrode which receives a signal based on the signal outputted from said first electrode of said first semiconductor amplifying device, and a first electrode which supplies a signal corresponding to the signal supplied to said control electrode to said output terminal;
   a first resistance type potential divider circuit connected to said bias terminal and which supplies a bias voltage to the control electrode of said first semiconductor amplifying device;
   wherein a first resistor for voltage division, included in said first resistance type potential divider circuit is formed over the same semiconductor chip as said first semiconductor amplifying device, and a second resistor for voltage division is separated from said semiconductor chip
   wherein said second resistor is provided between said bias terminal and said control electrode of said first semiconductor amplifying device, and said first resistor is provided between said control electrode of said first semiconductor amplifying device and a predetermined potential point; and
   further including a second resistance type potential divider circuit connected to said bias terminal and for supplying a bias voltage to the control electrode of said second semiconductor amplifying device, and
   wherein a third resistor for voltage division, included in said second resistance type potential divider circuit is formed over the same semiconductor chip as said second semiconductor amplifying device, and a fourth resistor for voltage division is separated from said semiconductor chip.

4. The wireless communication system according to claim 3, wherein said first semiconductor amplifying device performs class-A amplifying operation.

* * * * *